United States Patent

Takada et al.

[11] Patent Number: 5,855,735
[45] Date of Patent: Jan. 5, 1999

[54] PROCESS FOR RECOVERING SUBSTRATES

[75] Inventors: Satoru Takada, San Mateo; Hidetoshi Inoue, Cupertino, both of Calif.; Yoshihiro Hara, Nishi-ku, Japan

[73] Assignee: Kobe Precision, Inc., San Jose, Calif.

[21] Appl. No.: 538,265

[22] Filed: Oct. 3, 1995

[51] Int. Cl.$^6$ .................................................. C23F 3/00
[52] U.S. Cl. .................................. 156/636.1; 156/645.1; 216/88; 216/89; 437/228
[58] Field of Search .................... 216/88, 89; 156/636.1, 156/645.1; 252/79.5; 437/228

[56] References Cited

U.S. PATENT DOCUMENTS

| | | |
|---|---|---|
| 3,559,281 | 2/1971 | Mayberry et al. . |
| 3,905,162 | 9/1975 | Lawrence et al. . |
| 3,923,567 | 12/1975 | Lawrence ................................... 156/7 |
| 4,070,444 | 1/1978 | Ingle . |
| 4,137,123 | 1/1979 | Bailey et al. ........................... 252/79.5 |
| 4,138,509 | 2/1979 | Ingle et al. . |
| 4,276,114 | 6/1981 | Takano et al. ........................... 156/645 |
| 4,323,422 | 4/1982 | Calawa et al. . |
| 4,340,574 | 7/1982 | Coleman . |
| 4,582,560 | 4/1986 | Sanjurjo . |
| 4,588,473 | 5/1986 | Hisatomi et al. ...................... 156/645.1 |
| 4,676,967 | 6/1987 | Breneman . |
| 4,869,779 | 9/1989 | Acheson . |
| 4,944,836 | 7/1990 | Beyer et al. .......................... 156/645.1 |
| 4,994,139 | 2/1991 | Biermann et al. ...................... 156/630 |
| 5,131,979 | 7/1992 | Lawrence ................................ 156/655 |
| 5,133,829 | 7/1992 | Geyling . |
| 5,161,717 | 11/1992 | Geyling . |
| 5,178,840 | 1/1993 | Geyling . |
| 5,360,509 | 11/1994 | Zakaluk et al. ....................... 156/645.1 |
| 5,494,862 | 2/1996 | Kato et al. ............................ 156/636.1 |
| 5,514,245 | 5/1996 | Doan et al. ........................... 156/636.1 |
| 5,525,191 | 6/1996 | Maniar et al. ........................ 156/645.1 |
| 5,622,875 | 4/1997 | Lawrence ................................ 438/691 |

OTHER PUBLICATIONS

Lawrence, J.E., and Huff, J.R., *VSLI Electronics: Microstructure Science.* 5: 51–102 (1982).

Lawrence, J.E., Reprinted from: *Semiconductor Silicon.* "Correlation of Silcon Material Characteristics and Device Performance": 17–34 (1973).

Lawrence, J.E., *Metallographic Analysis of Gettered Silicon.* 242: 484–489 (Mar. 1968).

(List continued on next page.)

*Primary Examiner*—R. Bruce Breneman
*Assistant Examiner*—Anita Alanko
*Attorney, Agent, or Firm*—Jacques M. Dulin, Esq.

[57] ABSTRACT

A process comprising removing surface layer materials from the wafer by inducing micro-fractures in the surface using a rotating pad and an abrasive slurry until all of the surface layer materials are removed; and chemically etching the surfaces of the wafer until all micro-fractures are removed therefrom. Edge materials are removed by abrasive tape. Wafer thickness reduction during recycling is less than 30 microns per cycle. One of the front and back surfaces of the wafer substrate is polished, any dots or grooves being on the non-polished side. The abrasive slurry contains more than 6 volume percent abrasive particles, and the abrasive slurry has a viscosity greater than about 2 cP at ambient temperature. The preferred pad comprises an organic polymer having a hardness greater than about 40 on the Shore D scale, optimally a polyurethane. The pressure of the pad against the wafer surface preferably does not exceed about 3 psi. Preferably, the chemical etching solution contains potassium hydroxide. An acidic solution can then be applied to the wafer surface. The reclaimed semiconductor wafer can be a silicon wafer having a matted side having etch pits which does not exceed 20 microns in width, an average roughness not exceeding 0.5 microns and a peak-to-valley roughness not exceeding 5 microns. Any laser markings from the original wafer are present on the matted side of the wafer.

30 Claims, 3 Drawing Sheets

OTHER PUBLICATIONS

Lawrence, J.E., *Proceedings, Advanced Techniques in Failure Analysis Symposium.* "Crystallographic Imperfections And Their Effect On Micro–Electronic Performance": 52–57 (1976).

Lawrence, J.E., Reprinted from: *Electronic Packaging and Production.* "The case for Reclaim Wafers": 66–78 (Jan. 1974).

Lawrence, J.E., Reprinted from: *Electronic Packaging and Production.* "Silicon Wafer Reclamation: A Processing Service": 123 (Jul. 1975).

Exsil Company Brochure.

Multi–Client Market Study—published by Rose Associates (1992).

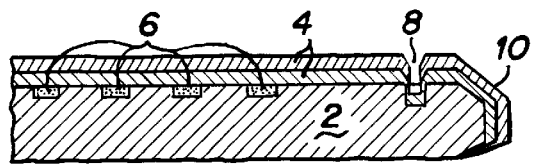
Fig_1
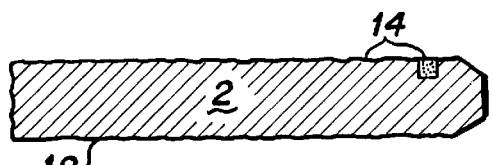
Fig_3
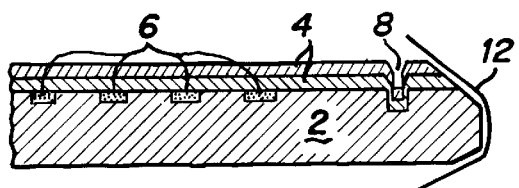
Fig_2
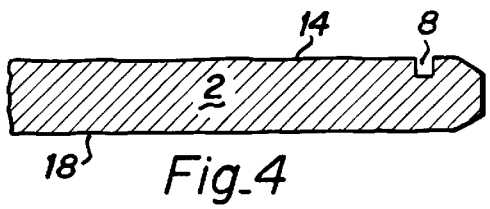
Fig_4
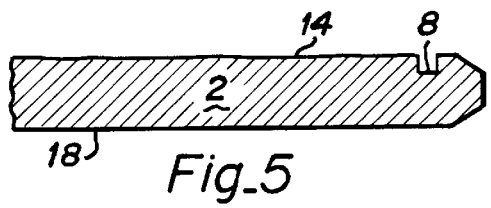
Fig_5
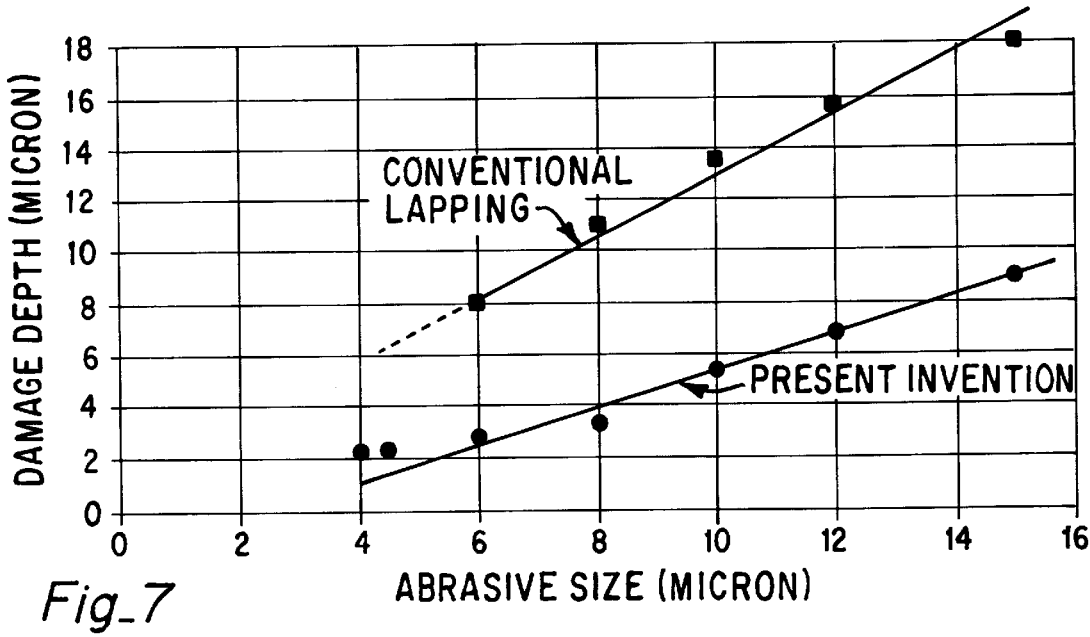
Fig_7
Fig_9
(THE INVENTION)
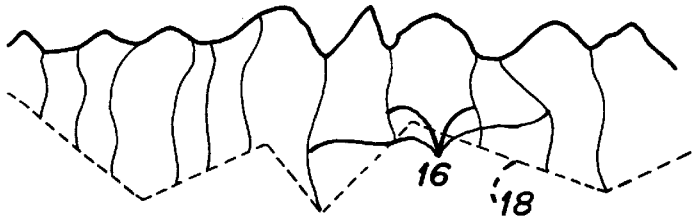
Fig_10
(PRIOR ART)

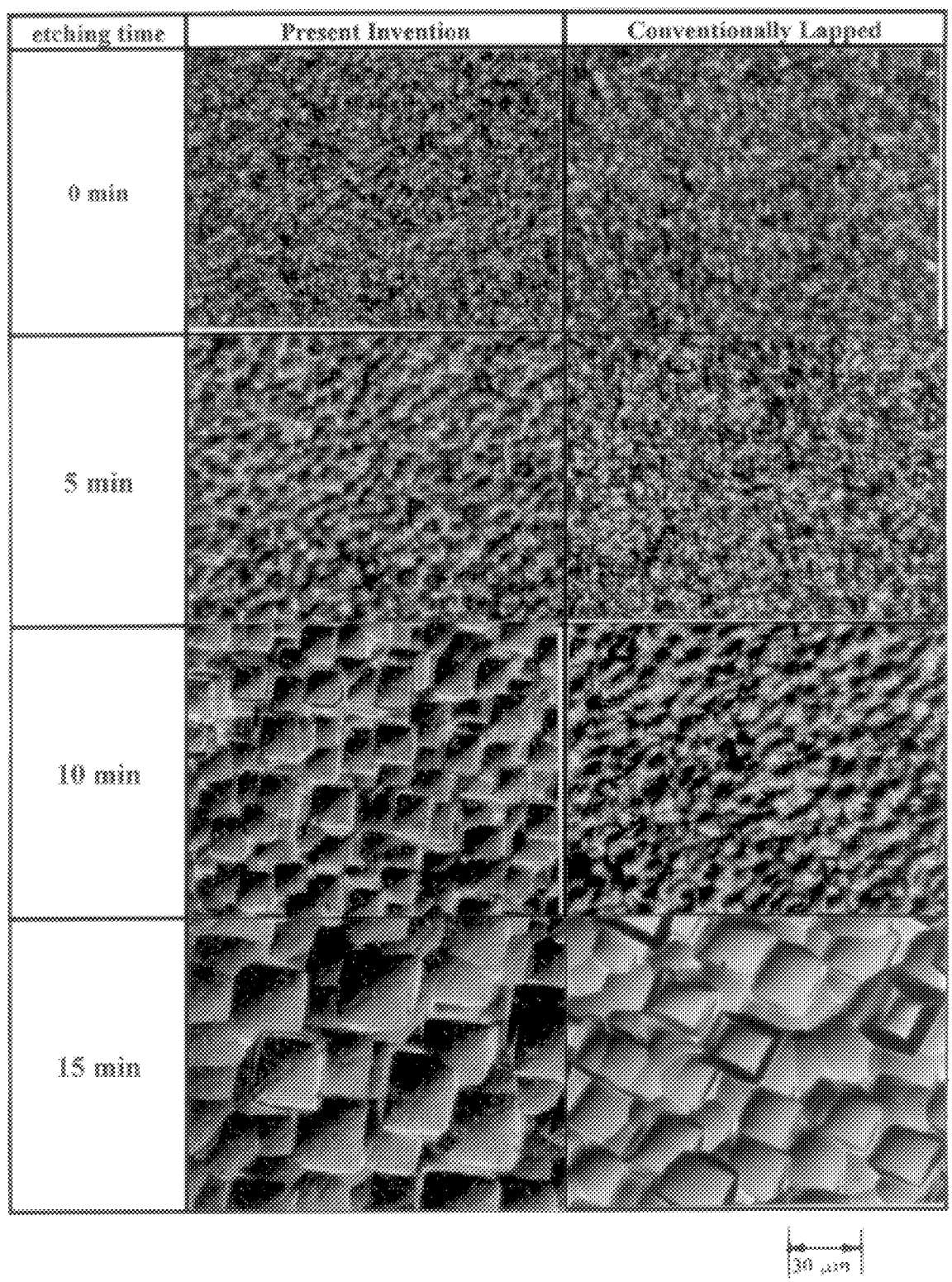
Fig_8

PROCESS FOR RECOVERING SUBSTRATES

FIELD OF THE INVENTION

This invention relates to a process for reclaiming a substrate wafer from a semiconductor wafer to yield a reclaimed wafer which has a quality meeting the standards for prime wafer substrates used for the manufacture of commercial semiconductor circuit products. In particular, the process of this invention reclaims used wafers with a minimum loss of wafer thickness, more than doubling the recycles obtained per wafer.

BACKGROUND OF THE INVENTION

Semiconductor circuit manufacturers require two qualities of crystalline silicon wafers to satisfy their production requirements: "prime" quality wafers for use in constructing actual semiconductor products; and "test" quality wafers for use to pre-qualify manufacturing processes for their satisfactory performance. "Prime" wafers are sold to satisfy higher quality standards than "test" wafers. "Test" wafers that exhibit quality standards close to that of "prime" wafers are preferred by semiconductor companies and are sold at a higher price than standard quality "test" wafers. A typical used semiconductor wafer comprises a silicon substrate wafer with semiconducting components implanted and/or diffused into one wafer surface (hereinafter called active surface). Layers of conducting and insulating materials are then formed on the implanted or diffused surfaces of the wafer.

The term "surface layers" as used herein refers both to the portion of the original wafer having implanted and/or diffused components and to the layers formed or deposited on the surface of the original wafer. The term "side" with reference to a wafer refers to a top or bottom surface. The term "edge" with reference to a wafer refers to the surfaces at the outer perimeter or edge of the wafer.

Reclaiming involves removing the layers and portions of the underlying wafer which have been implanted or diffused. Used wafers sent to a reclaim service company have a variety of surface and subsurface structures made from a diverse selection of materials. Some wafers have been used for film thickness monitoring and have several layers of film materials on the surface. Others may be rejects from product wafer manufacturing and have layered structures, sequences and compositions and implanted materials which differ from one wafer to another.

There are several methods in the prior art for reclaiming substrate wafers from used semiconductor wafers. Prior to this invention, these methods weakened the wafers, making them more susceptible to breakage. They furthermore removed such a large amount of material that only from one to three recycles per wafer were obtainable.

Chemical etching is one of the most common techniques used in prior art reclamation processes. Chemical etching for smaller wafers could be batch processes because of the relative uniformity and simplicity of the wafer layers. The process has serious disadvantages and is unsuitable for removing surface layers from larger diameter wafers because of their more complicated surface structures, both in layer sequences and compositions of the layers. The removal of multi-layered films by chemical etching is difficult because each layer of material requires a different etching chemical, leading to a multiple step process uniquely designed for each wafer construction and unsuitable for another wafer with a different structural order and composition. Etching procedures for large wafers are thus sequenced wafer-by-wafer and cannot be conducted in a batch operation with large sized (six inch and larger) wafers.

Furthermore, each of the layers can be patterned, leading to a rate of removal from one portion of a layer which is different from another. This ultimately produces an irregular surface pattern in the surface of the base layer which cannot be avoided. Tungsten silicide (WSi), for example, is extremely difficult to remove by chemical etching.

A mixture of nitric acid ($HNO_3$) and hydrofluoric acid (HF) is one of the etching compositions used for the reclamation of silicon wafers. Acetic acid is often added to the acid mixture as a buffer to reduce the etching rate for better control of layer removal. Although the mixture is effective for the removal of most film and implant materials, it also etches the substrate silicon wafer rapidly and in a non-uniform manner. Diffusion governs the reaction rate between silicon and the acid mixture, causing non-uniform etching. The acids are consumed more rapidly than they are replaced by the diffusion. When the diameter of the wafer is large, the solution in the central area of the disk is depleted since the acids moieties diffusing from the outer circumference of the disk are depleted before they reach the center of the wafer. Etching at the center is thus slower than at the circumference, leaving the center thicker than the outer portions.

This non-uniformity is even greater if the acid mixture is used for removing foreign materials from a used silicon wafer. Most foreign materials, such as oxide films and nitrides, are etched more slowly than silicon. When a used silicon wafer is submerged in the acid mixture, the acid mixture begins removing material near the circumference first, and by the time the materials at the center are removed, the substrate silicon is exposed to the chemical and etched more rapidly, making the circumferential area of the reclaimed product thinner than the center. The thickness variation can be as large as 20 to 40 microns for eight inch wafers. The product does not satisfy the customer's needs for a wafer of uniform thickness.

Lapping has been applied to removal of surface layers in preparing wafers. In this method, a work surface is pressed against a rotating metal plate while a slurry of abrasive particles is passed between the work surface and the plate. For double side lapping, the wafer is pressed between a pair of opposed metal plates, rotating in opposite directions. Surface removal proceeds as the metal lapping plates, most commonly cast iron plates, move the slurry across the work surface, causing impingement of the work surface by the abrasive particles, and causing micro-fractures of the work's subsurface layers. This process is called "lapping mode surface removal" in this application. The severe impingement occurring using a rigid plate causes deep micro-cracks of subsurface damage on the work's surface.

For semiconductor wafers, the subsurface damage caused by lapping is detrimental to the quality of the wafers if it remains in the final product because micro-cracks can be a source of particles and contamination. Removal of the micro-cracks from the work surface by chemical etching and polishing is required to present an acceptable surface. The amount of material removed in this step is determined by the depth of the deepest micro-cracks.

Lapping is commonly used in prime silicon wafer manufacture where it is used to reduce the thickness of a slice from a single crystal ingot to a specified thickness. Thickness reduction at a cutting rate as high as 5 to 10 microns/min is required for efficient production.

Wafers can also, in principal, be reclaimed by lapping. Unlike chemical etching, lapping removes various foreign materials on the wafer surface in a single step which is independent of the structure, pattern and composition of the layers. However, deep subsurface damage is caused during conventional lapping removal of surface layers, leading to excessive thickness reduction which, because it reduces the number of cycles obtained for each wafer, is not commercially desirable. The industry requirements are only satisfied by wafers having a certain minimum thickness.

Lapping removes materials from the top and bottom surfaces of the wafer, leaving layered materials on the wafer edge. Removal of the edge materials by chemical etching after lapping is undesirable because of the shortcomings of chemical etching processes noted above.

Polishing is a surface removal method which, for single side polishing, involves pressing a work surface against a rotating pad while a slurry of abrasive particles is fed between the pad and the work surface. For double-sided polishing, the wafer is pressed between a pair of opposed pads rotating in opposite directions. The pad holds small abrasive particles in its surface texture and transfers the particles to the work surface through the rotary motion. The work surface is removed by the abrasive particles as they "shave off" the work's surface. This is referred to as "polishing mode surface removal" in this application. The shaving action of the abrasive causes a shallower subsurface damage than lapping abrasive action.

Mechano-chemical polishing involves the addition of various chemicals to the abrasive polishing slurry. These chemicals are matched to the materials being polished to break or weaken atomic bonding at the work's surface and promote the shaving action of the particles. Polishing of silicon wafers employ very small, less than one micron, particles of colloidal silica along with various chemicals including potassium hydroxide (KOH), ammonium hydroxide ($NH_4OH$) and alkaloids. Single-side polishing is a common practice for polishing silicon wafers. The function of polishing is to remove the subsurface damage caused by the preceding lapping step and smooth the surface to a mirror finish.

Polishing is used as a final step in wafer reclaiming for the same purpose as for manufacturing prime wafers, that is, to smooth the surface of a lapped and/or etched wafer to a mirror finish. Prior to this invention, removal of foreign materials from used wafers was not used because the conventional polishing processes were not sufficiently aggressive to remove the variety of layers currently presented by used wafers. Polishing to a mirror finish is a conventional final step for preparing prime silicon working surfaces for deposition and implantation.

We have observed that removal of the deeper lattice defects introduced by grinding and lapping require substantial reduction of wafer thickness. Chemical etching to remove these deep lattice defects introduces large, geometrically shaped depressions (called "etch pits") because of etching rate differentials between the different facets of the silicon crystal. The large etch pit size is a result of deep subsurface damage caused by lapping or grinding. A lapped or ground wafer is etched to a depth which removes the subsurface damage or micro-fractures. The resulting wafer has large etch pits on both sides. At least one of the etch pitted surfaces is polished to a mirror finish in the subsequent polishing step. The polish removal must remove sufficient material to exceed the depth of the etch pits. The pit size thus determines the thickness reduction during the polishing step. With the reclaiming processes known prior to this invention, the etch pits have a width above about 20 microns and a corresponding undesirable depth.

Prime wafers are manufactured from thicker blanks or crude wafers sliced from an ingot by sawing, causing unavoidable deep subsurface damage. The etch pit size is not a major concern in prime wafer manufacture because the crude wafers are therefore prepared with sufficient thickness to produce a desired final thickness after the grinding, etching and polishing operations removing all subsurface defects are completed.

In the reclaimed wafer, however, deep etch pits on one side mean a large amount of material must be removed to provide a polished surface on the opposite side. If both sides are polished, the thickness loss is doubled. This severely limits the number of recycles obtained by reclaiming.

U.S. Pat. No. 3,559,281 discloses a method of chemical etching to remove conducting and insulating layers overlying an epitaxial base layer and preparation of the back side of the wafer for use as a working surface by chemical etching followed by polishing. Mechanical removal of the unwanted layers is discouraged as tending to "mechanically stress and weaken the wafer and epitaxial layer."

U.S. Pat. No. 3,923,567 also discloses a wafer reclaiming process comprising chemical etching to remove surface layers. This is followed by surface grinding to introduce lattice defects for gettering purposes. U.S. Pat. No. 3,905,162 discloses grinding processes for introducing lattice defects into finished wafers for gettering purposes.

U.S. Pat. No. 4,869,779 discloses a wafer polishing apparatus and its mode of operation.

U.S. Pat. No. 5,131,979 discloses a wafer reclaiming process comprising stripping away the layers to expose the original wafer surface by chemical etching, alone, or mechanical grinding followed by chemical etching. The wafer edge is removed by edge rounding. The surface is then polished smooth and thermally treated to free the surface of lattice defects and to leave interior lattice defect getter sites.

Grinding is used to remove surface layers and deliberately introduce deep lattice defects for gettering in the silicon structure. With the higher purity of presently available silicon wafers, gettering is no longer required, and the lattice defects are undesirable.

OBJECTS AND SUMMARY OF THE INVENTION

It is one object of this invention to provide a process for recycling semiconductor wafers with a minimum reduction in wafer thickness, whereby the wafer can be recycled a greater number of times.

It is another object of this invention to provide an improved process for recycling semiconductor wafers which yields a back surface free of lattice defects and with final etching pits which are smaller and a back surface which has a lower roughness than conventionally recycled wafers.

It is a still further object of this invention to provide a recycled wafer which retains its original identification marking for better traceability.

In summary, the process of this invention comprises a substrate with surface layers thereon, the process comprising the steps of (a) removing surface layer materials from at least one of the front and back surfaces of the wafer by inducing micro-fractures in the surface using a rotating pad and an abrasive slurry, preferably until all of the surface layer materials are removed; and (b) chemically etching the surfaces of the wafer until all micro-fractures are removed therefrom.

Preferably the process is preceded by the additional step of mechanically removing all of the surface layer materials from the edge of the wafer, leaving exposed substrate. An optimal method for removing the edge of the wafer is by relative movement of an abrasive tape contacting the edge of the wafer. Preferably, the abrasive tape comprises abrasive particles adhered to the surface of the tape, and the abrasive particles are selected from the group consisting of silicon carbide, aluminum oxide and mixtures thereof having an average particle size of about six microns.

A preferred process for producing a final recycled wafer includes the additional step of (c) polishing at least one of said front and back surfaces of the wafer substrate. When one of the surfaces of the wafer have laser marking dots and/or grooves and the other surface does not have dots or grooves, the surface polished is a surface without either dots or grooves.

In the preferred process, the abrasive slurry contains more than 6 volume percent abrasive particles, and the abrasive slurry has a viscosity greater than about 2 cP at ambient temperature. The abrasive particles in the slurry are particles selected from the group consisting of zirconium oxide, silicon carbide, aluminum oxide and mixtures of two or more thereof. The average size of said abrasive particles is in the range of about 5 to 16 microns.

The preferred pad comprises an organic polymer having a hardness greater than about 40 on the Shore D scale, optimally a polyurethane. The pressure of the pad against the wafer surface preferably does not exceed about 3 psig.

Preferably, the chemical etching step includes applying to the wafer surface an aqueous etching solution containing from about 20 to about 45 wt. percent potassium hydroxide having a temperature of from about 50° to about 100° C. An acidic solution can be applied to the wafer surface after applying said solution of potassium hydroxide. The acidic solution can contain from about 50 to about 100 wt. percent phosphoric acid having a temperature of from about 40° to about 140° C.

In the preferred process, the total thickness reduction of the wafer during the recycle processing is no greater than 30 microns.

In summary, a reclaimed silicon wafer of this invention has a matted side and a polished side, the matted side having etch pits which do not exceed 20 microns in width. The matted side surface preferably has an average roughness not exceeding 0.5 microns and a peak-to-valley roughness not exceeding 5 microns. Preferably, any laser markings from the original wafer are present on the matted side of the wafer.

Preferably, the reclaimed silicon wafer thickness is thinner than the unprocessed wafer by no greater than 30 microns to permit a maximum numbers of recycles. In other words, for a reclaimed wafer having been through one reclaiming cycle, the reclaimed wafer should have a thickness thinner than the standard thickness of a prime wafer of the same diameter by not more than 30 microns, and a matter surface having etch pits which do not exceed 20 microns in width.

BRIEF DESCRIPTION OF THE DRAWINGS

FIG. 1 is a partial cross-sectional drawing of a used wafer before recycling.

FIG. 2 is a partial cross-sectional drawing of a wafer of FIG. 1 after removal of the end layers.

FIG. 3 is a partial cross-sectional drawing of a wafer of FIG. 2 after removal of surface layers.

FIG. 4 is a partial cross-sectional drawing of a wafer of FIG. 3 after chemical etching.

FIG. 5 is a partial cross-sectional drawing of a wafer of FIG. 4 after polishing one of the surfaces.

FIG. 7 is a graph comparing the abrasive size versus subsurface damage depth of the present invention and conventional lapping.

FIG. 8 is a panel of microphotographs showing the development of etch pits during the etching step of a wafer processed by the method of this invention, compared with the development of etch pits in the same process step with a conventionally lapped wafer.

FIG. 9 is a schematic representation of subsurface damage from the pad and abrasive process of this invention.

FIG. 10 is a schematic representation of subsurface damage from conventional lapping.

DETAILED DESCRIPTION OF THE INVENTION

Figure 6:
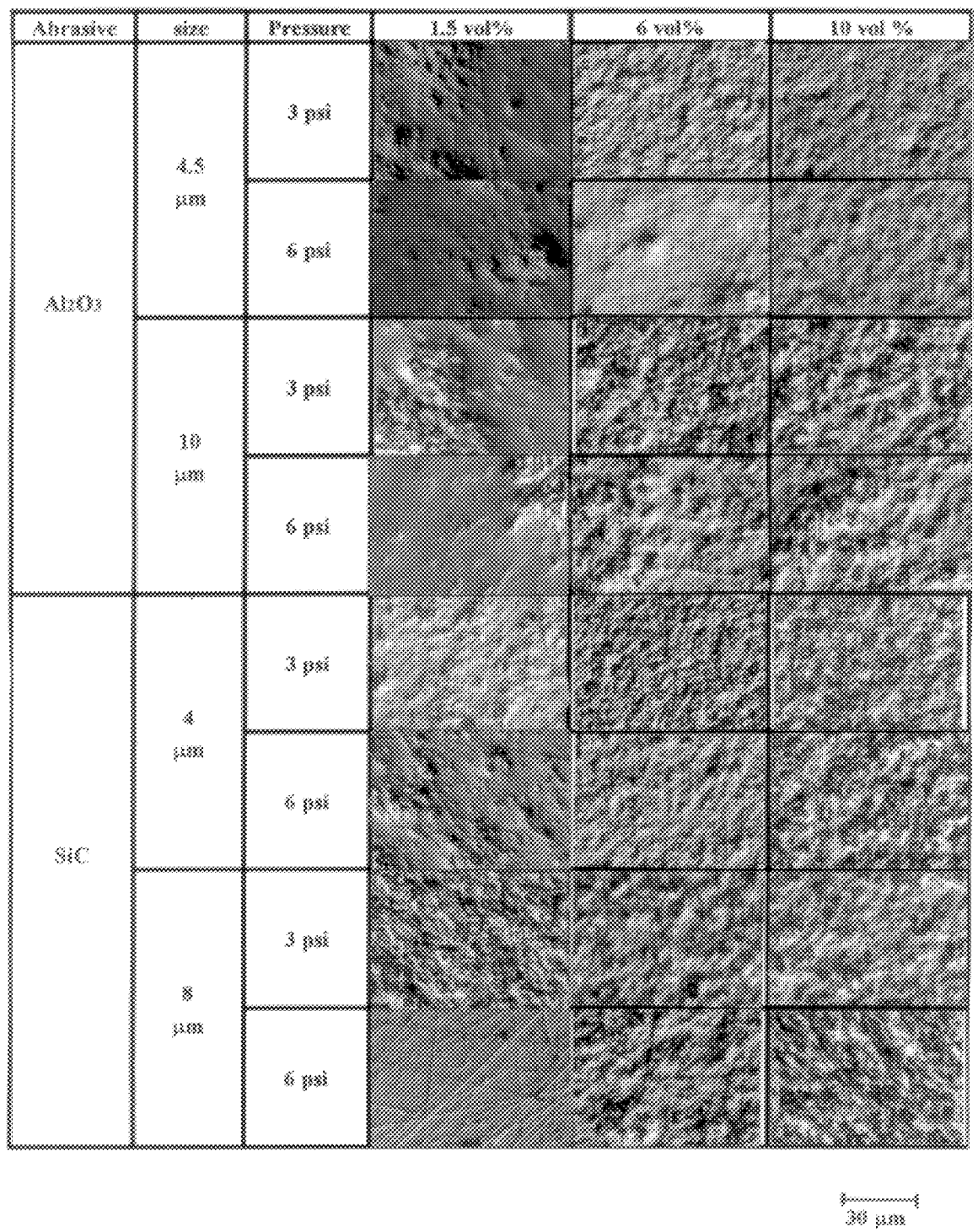
FIG. 6 is a panel of microphotographs showing the transition from polishing mode removal to the lapping mode removal is a function of abrasive size and pressure.

The process of this invention mechanically removes foreign materials from the front, back and edge surfaces of a used substrate wafer while introducing minimum damage to the top and bottom surfaces of the substrate, to yield a novel, superior reclaimed wafer.

The process of product of this invention is described hereinafter with respect to silicon semiconductor materials for purposes of clarity of presentation, not by way of limitation. It will be readily apparent that the process will also be applicable to reclaiming wafers made of other materials such as gallium arsenide, sapphire, gadolinium gallium garnet, indium phosphide and the like, and reclaiming processes and reclaimed products of these alternative materials are considered to be fully within the scope of this invention.

In general, the completed process includes the steps of:
a) mechanically removing materials from the edge of a used wafer;
b) removing materials from the front and back surfaces of the wafer by inducing micro-fracture to the wafer's surfaces layers through the action of a rotating pad and abrasive slurry;
c) chemically etching the whole surface include the edge; and
d) polishing at least one of said front and back surfaces.

FIG. 1 is a partial cross-sectional drawing of a used wafer before recycling, and FIG. 2 is a partial cross-sectional drawing of a wafer of FIG. 1 after removal of the end layers. The substrate 2 has one or more layers 4 on the surface thereof. It may also have implanted areas 6 and laser markings 8 in the surface.

In the first step, the film materials 10 covering the edge of the substrate wafer are removed by a mechanical means such as grinding or tape burnishing to provide a wafer edge 12 with completely exposed substrate material. Tape burnishing is a preferred method for this process step because it offers better control for a small, uniform removal throughout the circumferential edge. No reduction of wafer thickness occurs in this process step.

The edge grinding machines now available are designed for the grinding the edge of wafers cut from silicon (Si) ingot. Those grinding machines are usually position controlled; in other words, the grinding stone is positioned at a certain distance from the center of the rotating spindle on which the wafer is placed and grinds off the portion of the wafer exceeding that set distance.

The diameter of the as-cut wafer is larger than the finished diameter by hundreds of microns to avoid a requirement for accurate positioning of the incoming wafers exactly centered on the spindle.

On the other hand, reclaim wafers require only a minimum amount of removal from the edge, the edge grinder must have the capability of accurately placing the center of the wafer on the center of the rotating spindle, so that the edge of the grinding stone is always located at a small constant distance from the wafer edge. Currently no grinding machine with such an accurate positioning capability is available; however, it is technically possible to provide existing edge grinders with such a capability.

Tape burnishing is another method for removing the edge material. The burnishing machine usually operates in a pressure control mode. In other words, an abrasive tape is placed into point contact with a rotating wafer edge, and sufficient pressure is applied from behind the tape to cause the abrasive particles on the tape to contact and remove the edge of the wafer. This method, originally designed to provide a mirror-like finish on the prime wafer edge, offers a good control for removing a small portion (10 to 20 micron) from the edge.

In order to ensure the removal of all materials on the edge, it is preferable to use tapes with silicon carbide (SiC) and/or aluminum oxide ($Al_2O_3$) abrasive particles having average particle diameter of 6 microns or larger, or preferably 10 microns or larger. Abrasive particles smaller than this size may occasionally leave a residue from hard films such as nitrides.

The wafer processed by such a tape has a roughness feature of shallow striations running in the circumferential direction on or in the edge as an artifact of the burnishing using a coarse abrasive tape.

FIG. 3 is a partial cross-sectional drawing of a wafer of FIG. 2 after removal of surface layers, exposing the original acting surface 14 of the substrate. In the second step, micro-fractures are introduced to the surface layers 14. As described previously, this step is a unique method of surface removal designated for the exposure of substrate material in the reclamation process. The process step is designed to remove only 2 to 5 microns of thickness from the original wafer. This unique result is achieved by the combined action of the abrasive slurry and pad in this unique process step of this invention.

The pad used in this process step is preferably harder than 40 (shore D scale) to insure impingement of abrasive particles against the wafer surface. Polyurethane sheet is an example of suitable pad material for this purpose.

The slurry should have a concentration of abrasive particles which is sufficiently high to cause the "surface removal in lapping mode". If the abrasive concentration is lower, the surface removal tends to move toward the "polishing mode", leaving scratches on the surface.

FIG. 6 is a microphotograph of the surfaces of wafers processed by slurries having various abrasive concentrations. It shows the transition from polishing mode removal to the lapping mode removal is a function of abrasive size. As shown in the microphotographs, the wafer surface processed by a lower concentration slurry tends to exhibit scratches, an indicative of the "polishing mode surface removal", while the surface processed by a high concentration slurry exhibits many micro-cracks, an indicative of the "lapping mode surface removal". The transition from the "polishing mode" to "lapping mode" occurs at the slurry volume fraction of 6%. Also as shown in the microphotographs, applied pressures higher than 3 psig tends to cause polishing mode removal. It is preferable to apply a pressure lower than 3 psig.

The viscosity of the slurry should be higher than 2 cP at ambient temperature, so that the slurry can float the wafer away from the pad surface under the exerted pressure, and can feed sufficient amount of abrasive particles between the opposed surfaces of the pad and wafer. Lower viscosity slurries tend to cause a depletion of abrasive particles between the pad and wafer and shifts the process toward the polishing mode, degrading the wafer surface by scratching. The viscosity is controlled by the mixing ratio of abrasive, water and other additives including glycerol.

A variety of materials can be used for the abrasive particles. The particles must have sufficient hardness to disrupt the foreign material layered on the wafer surface, provided the slurry satisfies the requirements of volume fraction and viscosity described above. Zirconium oxide ($ZrO_2$), silicon carbide (SiC), and aluminum oxide ($Al_2O_3$) particles and their mixtures are examples of suitable abrasive particles for this process.

FIG. 7 depicts the depth of the subsurface damage of wafers processed by slurries having different abrasive sizes. The particle size of the abrasive also affects the depth of subsurface damage. The subsurface damage depths of the wafers lapped using the same slurries are included for comparison. The subsurface damage depths were evaluated by the step polishing method.

It should be noted that, for any abrasive size, the method of the present invention always results in a shallower damage depth than the conventional lapping. In order to maintain the damage depth less than 10 microns, it is preferable to use abrasive particles smaller than 16 microns in average diameter.

In case of lapping, any abrasive smaller than 6 microns tends to cause scratches and makes it difficult to produce a scratch free, uniformly matted surface. The present invention makes it possible to make such a scratch free, uniformly matted surface with less than 10 micron subsurface damage depth.

Any single or double side machine designed for conventional lapping or polishing can be used, although a double side machine is preferable since the reclamation of a used wafer calls for a total exposure of substrate material on the front and back surfaces.

It can be seen that the process step (b) of this invention employs a pad (or a pair of pads) in contrast with the lapping method which uses a metal plate (or a pair of plates). The abrasive particles in the slurry are impinged against the wafer surface by the pad rather than by the metal plate as in the case of lapping. The pad attenuates the force of the impingement and reduces the depth of subsurface damage. The resulting wafer has a significantly shallower subsurface damage when compared to the one caused by conventional lapping.

The rate of thickness reduction (or removal rate) with this method is less than 2 microns/min. and is significantly slower than that of the conventional lapping. The slow removal rate is advantageous, for wafer reclamation, since the primary purpose of this process step is to remove foreign materials such as films and implants on the substrate wafer and expose the substrate material with a minimum loss of thickness. The depth of removal required to eliminate those foreign materials is very small (usually less than 5 micron). The lapping method, with its high removal rate (typically 5 to 20 micron/min.), does not offer an adequate control for such a small removal. It tends to remove not only the foreign layered materials from the surface, but also a remove significant amount of substrate wafer material.

Although this process step employs a pad and slurry, the method is quite different from conventional polishing. This removal step relies thoroughly on the micro-fracture of the surface (lapping mode) rather than shaving the surface (polishing mode).

The difference between the two surface removal modalities is apparent from an examination of the wafer surfaces. The wafers processed by the method of this invention exhibit a dull, cloudy (or matted) appearance, while the wafers processed by conventional polishing exhibit a shiny surface. Microscopically, the morphology of the former surface is predominated by shallow micro-cracks, while the later surface is completely or almost featureless with occasional shallow scratches. Scratches are the artifacts of shaving action by abrasive particles.

Since the backside of a wafer are to be finished to a uniform "matted" appearance, the process parameters of this step must be carefully controlled to provide such a surface. A mirror surface or scratched surface caused by a polishing mode is detrimental because the backside is distinguished from the working surface by the matted appearance.

The sequence of edge removal and surface layer removal can be reversed. However, edge removal preferably proceeds surface layer removal.

Wafers are heavily soiled by abrasive slurry during and after the surface removal step and should be transferred immediately to the next process step, where the wafers are cleaned and chemically etched.

FIG. 4 is a partial cross-sectional drawing of a wafer of FIG. 3 after chemical etching.

Once the foreign materials of the used wafer have been removed and the substrate surface including the edge has been exposed by the previous steps, the wafer is ready for the chemical etching. The purpose of etching is to remove minor fractures, lattice defects and stressed surface material resulting from the previous process steps, and 1 to 5 micron material removal per side is sufficient to achieve this purpose in the process of the invention.

Although a mixture of nitric acid, hydrofluoric acid and acetic acid ($HNO_3$+HF+(HCOOH)) can also be used, the preferred chemical used for this etching step is 20 to 45 wt % potassium hydroxide (KOH) solution heated to 50° to 100° C. The solution offers a better uniformity and control of thickness removal compared to acid mixtures for the reasons described above.

The reclaimed wafers of present invention etched by KOH are characterized by almost square shaped etch pits particularly for {100} surfaced wafers with an average size of less than 20 microns, and roughness of no greater than 0.5 microns Ra, the pits are the artifacts of KOH etching applied to less than 10 micron deep subsurface damage. This etched surface remains in the backside of the final product.

Since KOH is an anisotropic etchant and etches {100} surfaces much faster than {111} surfaces, it leaves {111} surfaces. The resulting etch pits have a "pyramid" shape on {100} plane. Since {100} wafers represent the majority of wafers used in the industry, most of the Si wafers etched by KOH show these square shaped pits.

When KOH etches the subsurface damage layer (layer with micro fractures), the etching does not cause any etch pits since the crystal orientation in the damaged layer is randomized. The etch pit starts to form only after the etching has removed all of the damage layer and begins attacking the undamaged Si crystal.

FIG. 8 is a panel of microphotographs showing the development of etch pits during the etching step of a wafer processed by the method of this invention, compared with the development of etch pits in the same process step with a conventionally lapped wafer. As presented in FIG. 8, the wafer processed by the present invention begins to show etch pits within 5 min of etching time, while the conventionally lapped wafer does not show any indication of etch pit formation until 10 min. under the etching condition (35% KOH, 50° C.). The lapped wafer began to form etch pits after 15 min. of etching time, and the etch pit size was found to grow very rapidly after that. Pit sizes of smaller than 20 micron could not be obtained on the lapped wafer having subsurface damage deeper than 10 microns.

The inventors of the present invention attribute this difference in etching behavior to the difference in the distribution of crack depth of the micro-fracture depths. FIG. 9 is a schematic representation of subsurface damage from the pad and abrasive process of this invention, and FIG. 10 is a schematic representation of subsurface damage from conventional lapping. As shown in the FIG. 10 the lapped wafer has a wider distribution of crack depths 16, and the border between the damaged and undamaged crystal tends to be more zigzagged compared to the wafer processed by the method of present invention shown in FIG. 9. This zigzagged border 18 is the boundary where pit growth begins during the KOH etching process. The zigzagged part of the crystal plane is aligned toward the {111} plane; this is etched much slower than the {100} plane. When the chemical begins to attack such a zigzagged border, the {111} plane is more easily exposed by the etching. In other words, the etch pit formation is initiated heterogeneously by the zigzagged border. Thus, the zigzagged boundary increases the growth rate of the pit size, and the more linear boundaries produced by the process of this invention and shown in FIG. 9 provide a reduction in growth rate of the pit size. To the best knowledge of the inventors, no conventional process can provide the small pit sizes achieved by the process of this invention.

Since the total thickness reduction through the process steps from this invention are so small (usually less than 5 microns), the laser markings 8 of the original wafers may still remain on the surface after process step surface removal and alkaline etching. Those laser markings 8 which usually are small dotted indentations or grooves, can also have a deposit of foreign materials 14 in them. Especially when volatile metals such as aluminum are exposed in the surface in the laser marking, the metals can migrate through the wafer and contaminate the front surface of the reclaimed wafers.

It is an optional process step of this invention, to apply acidic etching to remove such volatile metals 14 found in the laser markings. $H_3PO_4$ and HCl are preferred etching chemicals, since they etch metals in a selective manner without etching the Si substrate wafer. Solutions of 50 to 100 wt. % $H_3PO_4$ heated to 40° to 140° C. has been found to effectively remove volatile metals such as aluminum. No reduction of wafer thickness occurs during the acidic etching.

It can be seen that the chemical etching step is applied only after all the foreign materials are removed by the previous steps, so that the substrate material is etched more uniformly throughout the surface.

The purpose of etching is to relieve the residual stress and to remove loose fragments of the substrate wafer caused by the micro-fractures in the previous process step. A removal of 2 to 20 microns in thickness is sufficient to achieve this purpose.

KOH is a preferred etching chemical used for this step, however, $HNO_3$+HF+(HCOOH) mixture can also be used.

Even the latter chemicals, used in accordance with the method of this invention, results in a better thickness uniformity than the prior art of chemical etching, because this invention prevents the differential etching rate between the foreign material and substrate wafer.

FIG. 5 is a partial cross-sectional drawing of a wafer of FIG. 4 after polishing one of the surfaces.

The final step is polishing. One of the major advantages of the process of this invention is that the subsurface damage created during removal of the surface layers is so shallow that the damaged portion can be removed with a comparatively small removal of stock by polishing.

This offers two major advantages to the wafer reclamation. Firstly, the small polishing removal reduces the thickness reduction of the wafers during the total process and enables the return of thicker wafers. Secondly, it reduces either the polishing time or polishing steps (or both), and thus reduces the cost of polishing the wafers. The polishing cost of wafers is more significant as the diameter of the wafers becomes larger. Polishing is a batch process.

Due to the limited size of available polishing equipment, the number of pieces which can be polished in a single batch decreases as the diameter of wafers becomes larger. This results in a significant increase of the polishing per individual wafer. The reduction of polishing removal and polishing time reduces the polishing cost, and total cost of the recycled wafers significantly.

In a conventional process in which lapped wafers are polished, it is common to apply a "three-step polish" or a "quasi-two-step polish", in which the lapped wafers are first subjected to one or two steps of "stock removal polish", and then finished by the "final polish". The former steps were designed to remove the damaged layer, and the later steps were designed to smooth the roughness of the stock-polished surface and to provide a mirror-like finish.

A typical lapped wafer has subsurface damage of about 10 to 15 microns deep, and the typical stock-polishing removes 1.5 times the depth of the damage (or 15 to 22 micron) in order to take into account the thickness variation to the wafer. With a typical stock removal polishing rate of 0.7–0.8 micron/min, 20 to 30 minutes of stock removal polish are required to remove this subsurface damage. The stock polished wafer products are subjected to the final polish, a step which usually takes approximately 10–15 minutes. It is a common practice in the industry to split the stock polish step into two steps and run approximately 10–15 minutes of polish for each step including the final polish step (three step polish). It is also a common practice to assign two stock removal polishers for each final finish polisher since the stock polish takes almost two times longer than final finish polish (quasi-two-step polish). To the best knowledge of the present inventors no "true-two-step-polish" process, in which two polishers assigned respectively to "stock" and "final" are synchronized in a short cycle time, has been reported. The lapping process has a limit in the reduction of subsurface damage, since it was originally developed to reduce the thickness of as-sawed wafers at an efficient rate.

According to the process of this invention, the subsurface damage induced by the surface layer removal is less than 8 microns, and a stock removal of 8–15 micron (typically 8–10 micron) is sufficient to remove the subsurface damage. This makes it possible to completely synchronize the stock and final polish times at approximately 10 to 12 minutes per cycle, increasing the productivity of polishers and thus decreasing the process cost.

Although any conventional wafer polishing method can be applied to either or both of the front and/or backside surface of the original wafer, it is preferable to polish the side opposite to the laser marked surface.

A used wafer, which originally was cut from an ingot and has never been reclaimed, has some laser markings 8 for ID on the front side or the side that is polished. The laser markings are letters or numeric characters made of dotted indentations or grooves, and usually as deep as 20 to 50 microns. If the wafer is used for a monitoring purpose, films of various materials are deposited on this side of the wafer, leaving deposits of materials 14 in the indentations or grooves of the laser marking. The used wafer is sent to a reclaim service company.

When the used wafer is reclaimed by the process of this invention for the first time, the total thickness removal through process steps from FIG. 1 to FIG. 3, is usually as small as less than 10 microns (or less than 5 microns from each front and back surface), and in most of the cases, the laser markings on the original front surface remains even after the FIG. 3 stage. Polishing side 18 opposite to the laser marked surface 14 leaves the laser mark on side 14, now the back (matted) side.

The wafer thus reclaimed is shipped to a semiconductor company, serves its purpose, shipped back to the reclaim service company for the second cycle, goes through the same process steps as the first reclaim cycle. This time the wafer has laser markings on the backside. Again, the side opposite to the laser marked surface 14 is polished. This reclaim cycle continues until the wafer becomes too thin to be used, and the laser marking remains on the backside (matted side) in most cases until the last cycle.

The selection of surface 18 for polishing offers two advantages. The first advantage is that leaving the laser marking on the backside (matted side) of a wafer helps to keep the front surface (polished side) clean. Although the deposited materials in the laser marking can be removed by the optional acid etching step of this invention, the laser markings are potential contamination sources because, in general, the interior surfaces of indentations and grooves are rough and can easily trap contamination.

The second advantage is that leaving the laser marking provide a means for tracing wafers. It is a common practice in the semiconductor industry, especially where the larger diameter wafer are involved, to keep a record of history for each wafer to minimize the risk of cross contamination.

The thickness of wafers reclaimed according to the process of this invention is only slightly thinner than the starting thickness of the wafers before processed. Table 1 summarizes the removal at each process step when a wafer is reclaimed for the first cycle.

TABLE 1

Surface Removal at Each Process Step

| Process Step | Front Surface, $\mu$ (Laser marked) | Back Surface, $\mu$ | Thickness Reduction, $\mu$ |
|---|---|---|---|
| FIG. 2 | 0 | 0 | 0 |
| FIG. 3 | 1.0 to 2.5 | 1.0 to 2.5 | 2 to 5 |
| FIG. 4 | 1.0 to 5 | 1.0 to 5 | 2 to 10 |
| FIG. 5 | 0 | 8 to 15 | 8 to 15 |
| Process Total | 2.0 to 5.0 | 10 to 20 | 12 to 30 |

From the second reclaim cycle on, the wafer has the laser marking on the back surface, and 8 to 15 micron of polishing removal is imposed on the front surface 18. As shown in the table, the thickness reduction of a wafer during the total reclaim process is less than 30 microns and can be as small as 12 microns. To achieve such a small total removal requires use of the pad and abrasive slurry process steps of this invention.

The wafers reclaimed by the process steps described above have the following features:

1) The reclaimed wafers of this invention are thinner than the original wafers by only less than 30 microns.
2) The reclaimed wafers of this invention have almost square shaped etch pits with average size of less than 20 microns on the backside and roughness of no greater than 0.5 microns (Ra), which are the artifacts of KOH etching applied to less than 10 micron deep subsurface damage. It is noted that no prior art reclaiming process can achieve such a shallow subsurface damage, and consequently such a small etch pit size on the backside.
3) The reclaimed wafers of this invention is also featured by the original laser markings left on one of the surfaces. No reclaim process disclosed by the prior art can offer a removal small enough to leave the original laser markings on the surface.
4) It is a preferable feature of the reclaimed wafers of this invention to have original laser markings on the backside.

Wafers having a diameter of about 8 in. (200 mm) have a standard thickness of 725 microns by SEMI specifications, and wafers having a diameter of about 6 in. (150 mm) have a standard SEMI standard thickness of either 625 microns or 675 microns. The thickness tolerance can be ±15, ±20, ±25 microns or ±50 microns, depending upon the quality grade or size. The reclaimed wafers of this invention which have been through a single reclaiming cycle, when compared to the original wafer, has a thickness reduction of less than 30 microns. In other words, the reclaimed wafers have a thickness thinner than the standard thickness of a prime wafer of the same diameter by not more than 30 microns.

The invention claimed is:

1. A process for reclaiming a substrate wafer from a semiconductor wafer having at least one surface layer of foreign material such as film(s) or implant(s) applied on at least one of a front and a back surface of said substrate comprising the steps of:
   (a) contacting at least one surface of a semiconductor wafer to be reclaimed with a controlled viscosity of abrasive suspended in a carrier fluid;
   (b) applying a polymeric pad in a rotational motion generally parallel to said wafer foreign material surface layer while applying pressure normal to said surface layer, said pad having a hardness sufficient to produce impingement of granules of said abrasive onto said surface layer, but soft enough to attenuate the force of impingement to reduce the depth of subsurface damage in said substrate;
   (c) controlling said pressure during said rotational motion of said pad on said wafer surface layer in an amount sufficient to induce microfractures in said substrate surface, to a depth of less than an average of about $10\mu$, by said impingement of abrasive granules without introducing shaving of said substrate surface as evidenced by substantial numbers of substrate surface scratches or grooves; and
   (d) maintaining said pressure and said rotational motion for a time period sufficient to remove substantially all of said surface layer with minimum reduction of said substrate to produce a reclaimed substrate wafer of quality substantially equivalent to the substrate before said surface layer was applied thereto, wherein said wafer substrate thickness reduction is less than about $30\mu$, as compared to the thickness of the substrate of the semiconductor wafer before reclaiming processing.

2. A wafer reclamation process as in claim 1 wherein:
   a) said abrasive slurry includes above about 6 volume percent abrasive particles and has a viscosity of above about 2 cP at ambient temperature;
   b) said polymeric pad has a Shore D hardness of greater than about 40;
   c) said pressure is less than about 3 psig; and
   d) the wafer substrate thickness reduction is less than about $30\mu$.

3. A process of claim 1 including, before step a), the additional step of mechanically removing all of the surface layer materials from the edge of the wafer, leaving exposed substrate edge.

4. A process of claim 3 wherein the surface layer materials are removed from the edge of the wafer by relative movement of the edge of a wafer and an abrasive tape in contact therewith.

5. A process of claim 4 wherein the abrasive tape comprises abrasive particles adhered to the surface of the tape, and the abrasive particles are selected from the group consisting of silicon carbide, aluminum oxide and mixtures thereof having an average particle size of about six microns.

6. A process of claim 1 including the additional step of:
   e) polishing at least one of said front and back surfaces of the wafer substrate produced in step d).

7. A process of claim 6, wherein the thickness reduction after completing the process is no greater than 30 microns.

8. A process of claim 7 wherein one of the surfaces of the wafer has laser marking dots and/or grooves and the other surface does not have said dots or grooves, and the surface polished is said other surface.

9. A process of claim 1 wherein the abrasive slurry contains more than 6 volume percent abrasive particles.

10. A process of claim 1 wherein the abrasive slurry has a viscosity greater than about 2 cP at ambient temperature.

11. A process of claim 1 wherein the abrasive particles in the slurry are particles selected from the group consisting of zirconium oxide, silicon carbide, aluminum oxide and mixtures of two or more thereof.

12. A process of claim 11 wherein the average size of said abrasive particles is in the range of about 5 to 16 microns.

13. A process of claim 1 wherein the pad comprises an organic polymer having a hardness greater than about 45 on the Shore D scale.

14. A process of claim 13 wherein the polymer is a polyurethane.

15. A process of claim 1 wherein the pressure of the pad against the wafer surface does not exceed about 3 psig.

16. A wafer reclamation process as in claim 2 wherein:
   a) said abrasive is selected from the group consisting essentially of ZrO, SiC, Al$_2$O$_3$ and mixtures thereof; and
   b) said abrasive particles have an average size in the range of from about $5\mu$ to about $16\mu$.

17. A wafer reclamation process as in claim 1 wherein:
   the surface microfracture depth induced by application of said pad on said abrasive slurry, on average, is substantially shallower and more uniform than surface cracks from metal pad lapping.

18. A wafer reclamation process as in claim 17 wherein said average surface microfracture depth is on the order of about $8\mu$.

19. A wafer reclamation process as in claim 17 wherein said microfractures result in pit growth from subsequent chemical etching to a size on the order of less than about $20\mu$, said etch pits are generally square-shaped in aspect for {100} surfaced wafers and have a roughness no greater than about $0.5\mu$ Ra.

20. A wafer reclamation process as in claim 1 which includes the added step of:

chemically etching said microfractured surface for a time sufficient to remove minor fractures, lattice defects, stressed surface material and up to about $5\mu$ of substrate material, and produce a matted surface texture characterized by generally square shaped pits for {100} surfaced wafers, which pits have an average size of less than $20\mu$ and a peak to valley roughness of no greater than about $5\mu$.

21. A process of claim 20 wherein the chemical etching step includes applying an aqueous etching solution containing from about 20 to about 45 wt. percent potassium hydroxide having a temperature of from about 50° to about 100° C.

22. A process of claim 21 wherein an acidic solution is applied to the wafer surface after applying said solution of potassium hydroxide.

23. A process of claim 22 wherein the acidic solution contains from about 50 to about 100 wt. percent phosphoric acid having a temperature of from about 40° to about 140° C.

24. A wafer reclamation process as in claim 1 wherein said wafers are selected from silicon, gallium arsenide, sapphire, gadolinium gallium garnet and indium phosphate.

25. A wafer reclamation process as in claim 1 which includes the added step of:

removing surface layers from an edge of said wafer by application of a tape to which are secured abrasive particles having an average size on the order of above about $6\mu$.

26. A wafer reclamation process as in claim 20 which includes the added step of polishing at least one of said wafer surfaces.

27. A wafer reclamation process as in claim 1 wherein said slurry is substantially chemically inert.

28. A wafer reclamation process as in claim 1 wherein said slurry includes glycerol as a viscosity control agent.

29. A wafer reclamation process as in claim 20 wherein the resulting wafer has a first polished surface and a second matted surface.

30. A wafer reclamation process as in claim 22 which includes the added step of polishing at least one of said wafer surfaces.

* * * * *